United States Patent [19]

Picquendar et al.

[11] 3,986,177
[45] Oct. 12, 1976

[54] SEMICONDUCTOR STORE ELEMENT AND STORES FORMED BY MATRICES OF SUCH ELEMENTS

[75] Inventors: Jean-Edgar Picquendar; Pham Ngu Tung, both of Paris, France

[73] Assignee: Thomson-CSF, Paris, France

[22] Filed: Oct. 16, 1975

[21] Appl. No.: 623,080

[30] Foreign Application Priority Data
Oct. 18, 1974 France .............................. 74.35144

[52] U.S. Cl. ............................ 340/173 R; 307/238
[51] Int. Cl.² ......................................... G11C 11/40
[58] Field of Search .................. 340/173 R, 173 FF; 307/238, 279

[56] References Cited
UNITED STATES PATENTS
3,715,732  2/1973  Lynes ............................ 340/173 FF

*Primary Examiner*—Terrell W. Fears
*Attorney, Agent, or Firm*—Cushman, Darby & Cushman

[57] ABSTRACT

A novel semiconductor store element comprises a bistable pnpn structure of the kind described in the copending Patent application Ser. No. 527,918, addressed by a structure of the same type. The system has an area of the order of 10 to 20 square microns and possesses a high switching speed.

5 Claims, 6 Drawing Figures

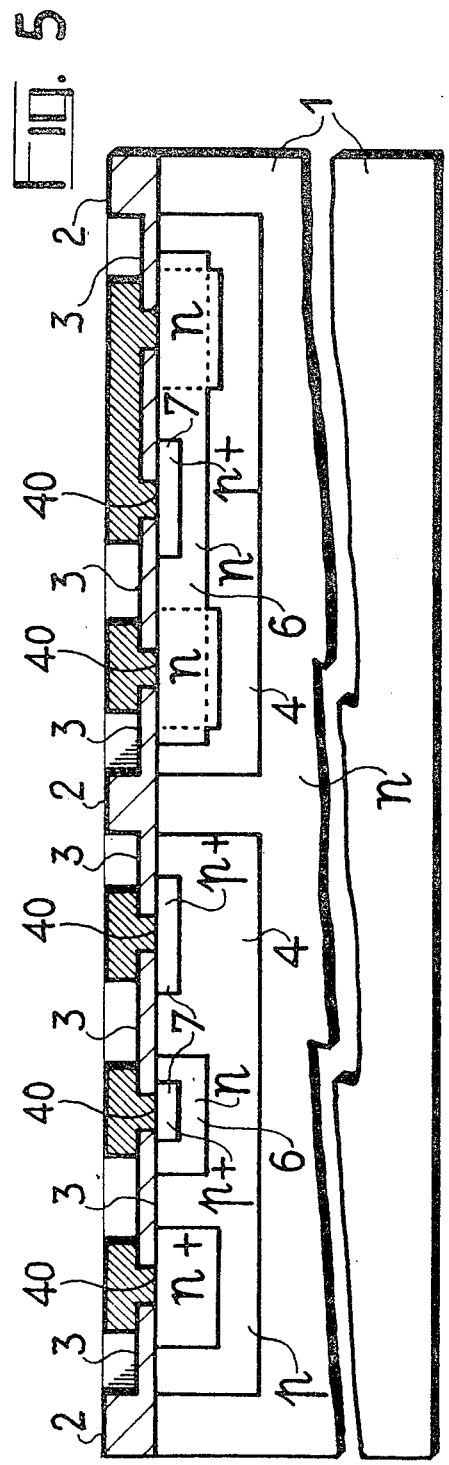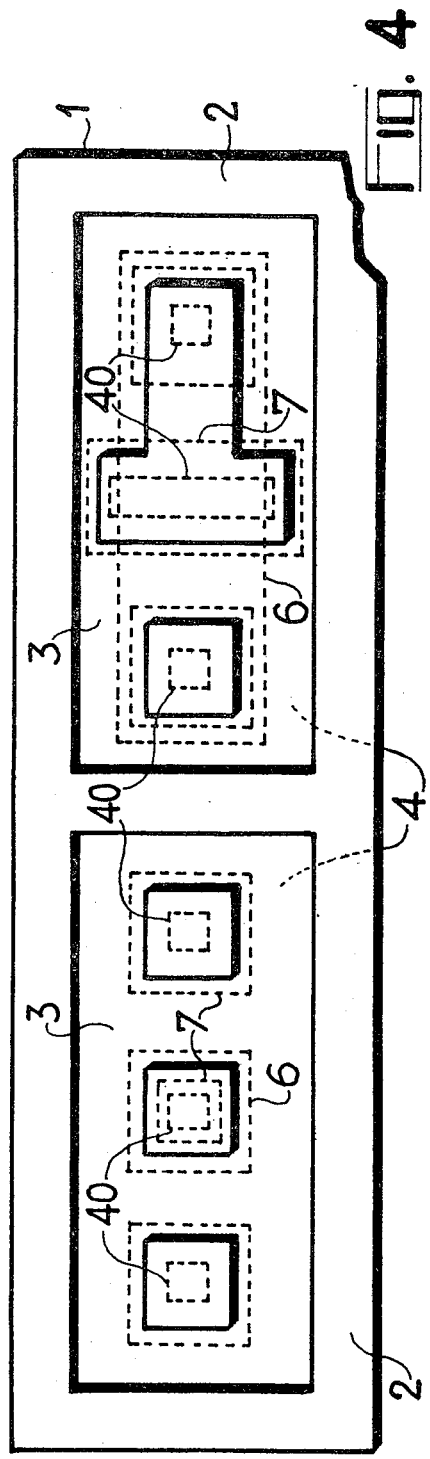

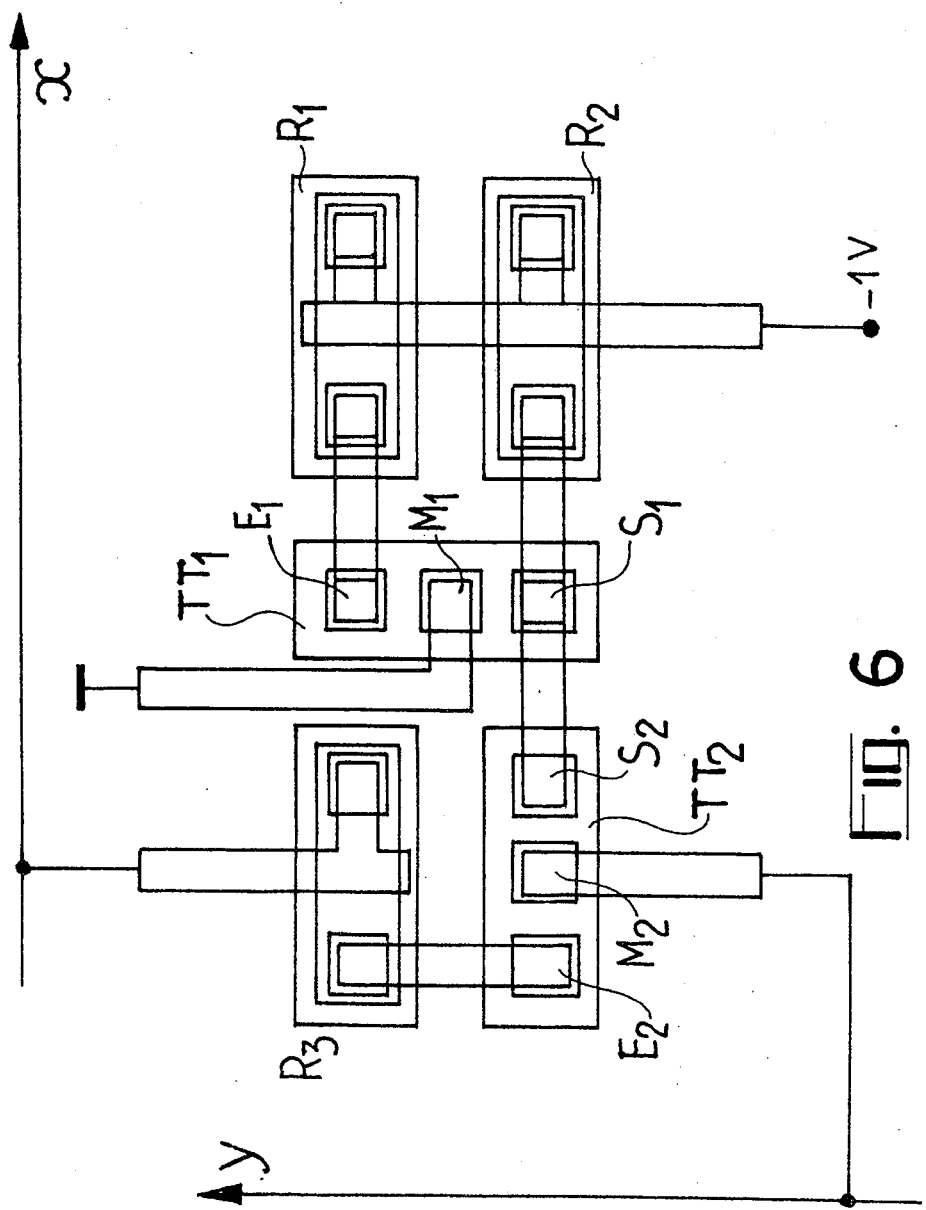

SEMICONDUCTOR STORE ELEMENT AND STORES FORMED BY MATRICES OF SUCH ELEMENTS

In a copending U.S. Pat. application filed the under the Ser. No. 527,918 a novel electronic component which, under the effect of applied voltages, could acquire two stable states, one in which it is conductive and the other in which it is blocked, was disclosed.

This component enables a large scale integration to be achieved and has a high switching speed.

The invention relates to a store element which can acquire two stable states and comprises two components of the aforesaid kind, and load resistors.

The invention will be better understood from a consideration of the ensuing description and by reference to the attached drawings in which:

FIGS. 4 and 5 are respectively a plan view and a sectional view of a transverse plane, of a so-called TT structure and a load resistor, integrated into the same substrate;

FIG. 6 illustrates in plan, the integration diagram of the device shown in FIG. 3.

Figure 1:
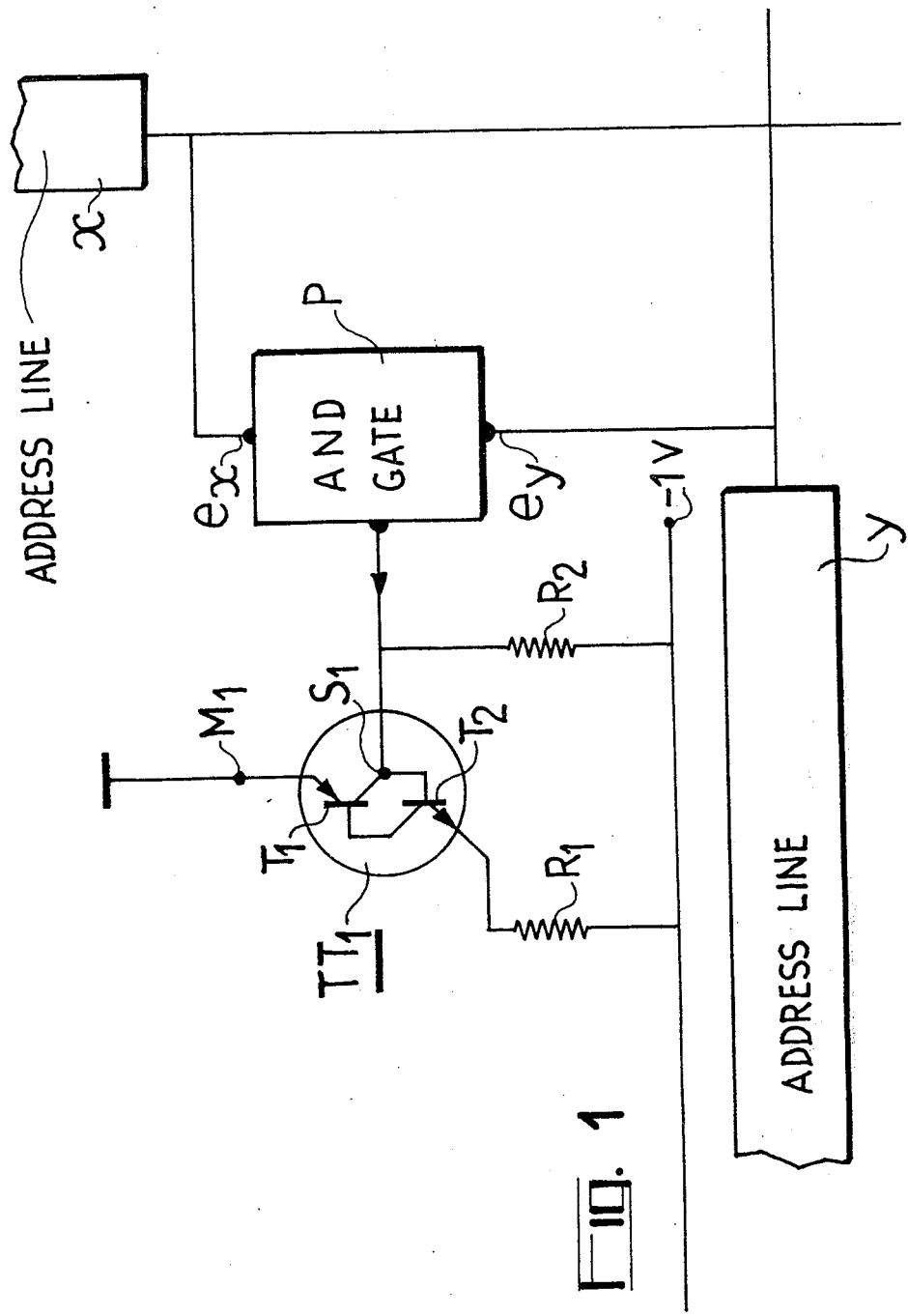
FIG. 1 is a block diagram of the store element in accordance with the invention.

In FIG. 1, a storage element in accordance with the invention has been shown. It comprises a component $TT_1$ formed by two complementary transistors as described in the aforementioned Patent Application, which will be designated hereinafter by the letters TT.

The emitter $M_1$ of the first transistor $TT_1$ is grounded; the two collectors of the first and second transistors are connected the negative pole of a d.c voltage source not shown supplying 1v across load resistors $R_1$ and $R_2$ respectively.

A two input AND gate P connected to the collector $S_1$ of the transistor $T_1$ (base of the transistor $T_2$), to the two address lines $x$ and $y$. Write-in is performed through the medium of this gate which has two inputs $e_x$ and $e_y$ respectively connected to the address lines $x$ and $y$. A fixed voltage applied to the line $x$ enables the gate P to be opened; it then transmits to the point $S_1$ the voltages applied to the line $y$, which voltages enable information to be written into and read out of the component $TT_1$.

The operation of the system is as follows:

The word signal is applied to the line $y$. The gate P is then opened and transmits to the point $S_1$ the voltage applied to the digit line.

The two subsequent operations will now be described:

A. Information write-in.

1. Writing-in 1:

A voltage of $-1$ v is applied to the point $S_1$. This voltage blocks the first transistor. No current flows through the resistor $R_1$. The stable system $TT_1$ is blocked in this condition and remains so.

2. Writing in 0:

A voltage substantially equal to 0 v is applied to the point $S_1$. The transistor $T_1$ conducts as also does the transistor $T_2$. The resistor $R_1$ carries a relatively high current; the system $TT_1$ conducts.

B) Information read-out.

The gate P is open. The voltage at $S_1$ is transmitted to the line $y$. Read-out is non-destructive.

Figure 2:
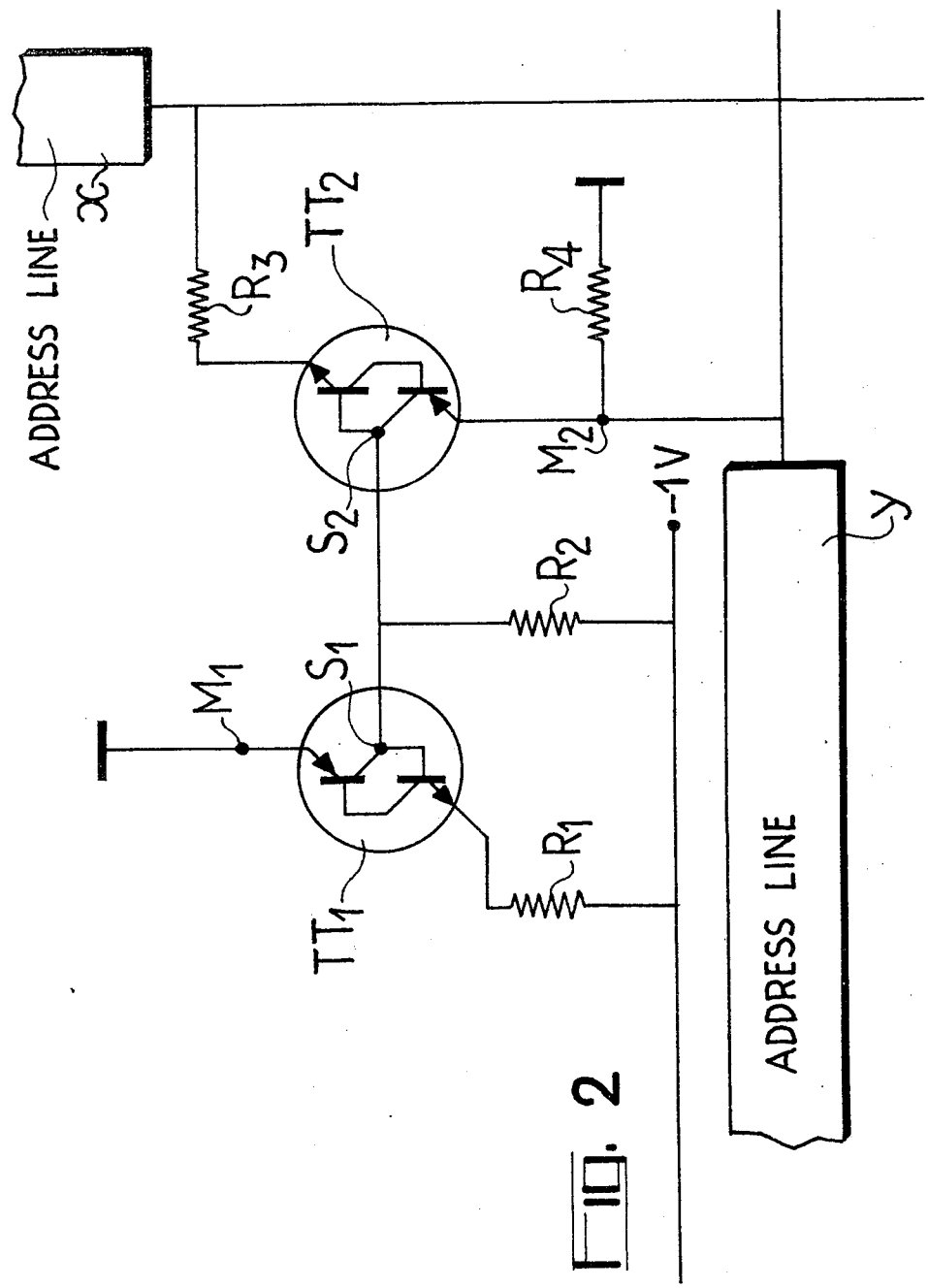
FIG. 2 is the diagram of an example.

The FIG. 2 illustrates the store point with an embodiment of a two-way access gate. The gate comprises a component $TT_2$ whose pnp transistor has its emitter $M_2$ connected to the address line $y$, the emitter of the npn transistor being connected to the address line $x$ by a resistor $R_3$. The emitter of the pnp transistor is furthermore grounded across a resistor $R_4$.

$x$ addressing is effected by placing the corresponding $x$ line at a sufficiently low potential to drive the component $TT_2$ conductive whatever the potential at $M_2$ which is always close to ground potential. The voltage at the point $M_2$ (emitter of the pnp transistor of $TT_2$) therefore appears at the base of the pnp transistor $TT_1$; the component $TT_1$ therefore acquires one state or the other, depending upon the level of this voltage.

Figure 3:
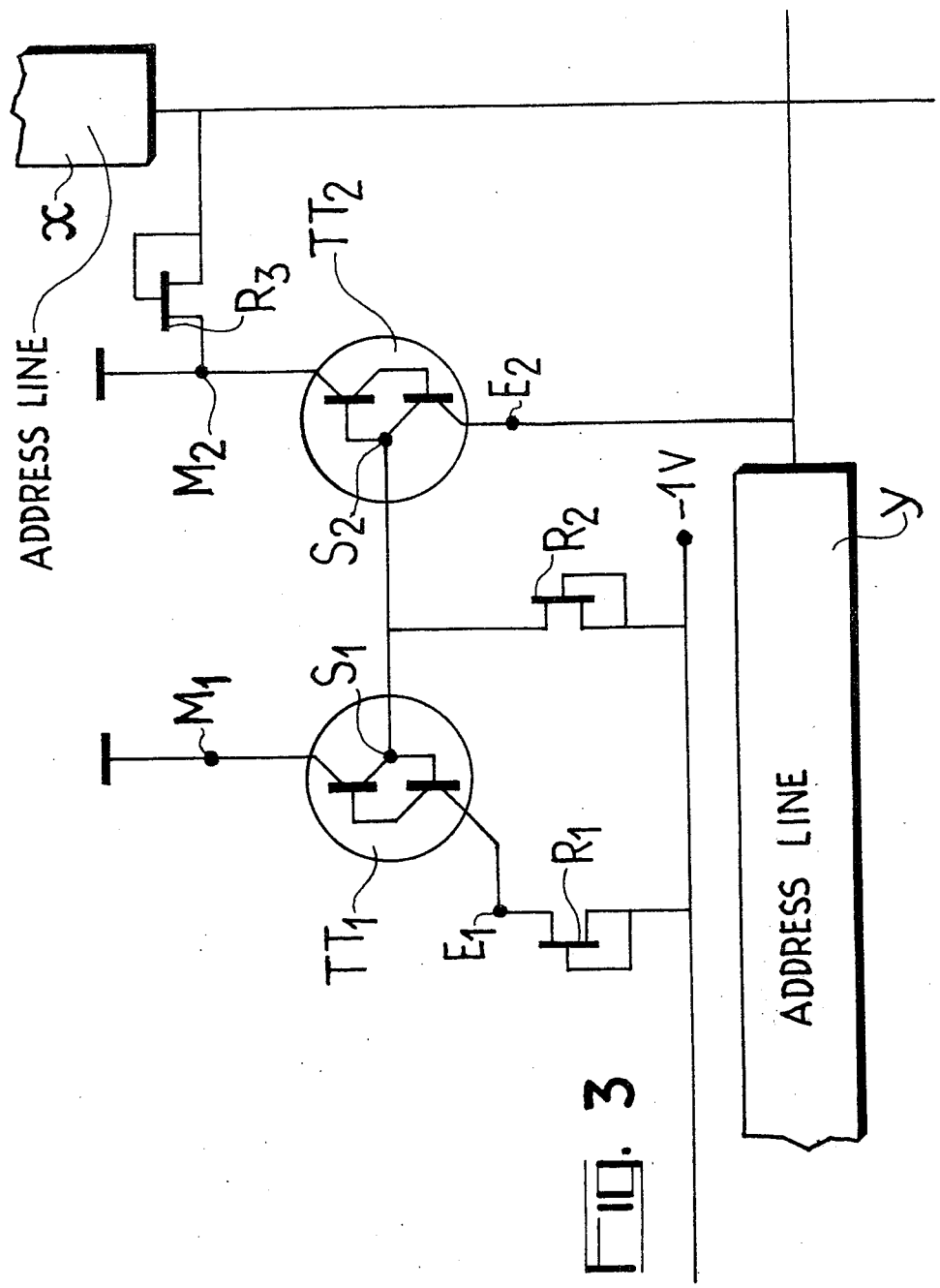
FIG. 3 is a variant embodiment of the device shown in FIG. 2.

FIG. 3 illustrates a modification of the memory element of FIG. 2. In this figure, the load resistors are replaced by field-effect transistors in each case with their gate and source interconnected, acting as saturable resistors, namely the resistors $R_1$ and $R_2$ associated with the component $TT_1$ and that $R_3$ associated with the component $TT_2$.

A store cell of this kind can be manufactured by integration.

FIGS. 4 and 5 respectively illustrate in plan and cross-section a TT system and a saturable resistor $R_1$, integrated into one and the same substrate 1. The technique used are those of electronic masking and ion implantation. In one embodiment, the substrate is of n-type material with an impurity concentration of $10^{14}$ at/cm$^3$. On said substrate there has been deposited, for example by in situ oxidation, a layer 3 of oxide $SiO_2$, having a thickness of 6000 A.

In this layer, a window has been formed in order to implant in the substrate the p-type zones 4 which are one micron in thickness and having a doping concentration of $10^{16}$ at/cm$^3$.

On the assembly, there has been deposited an oxide layer 2 (thickness 400 microns). In this layer, there have been formed, by chemical attack, windows 40 or other well known processes through which there have been implanted the zones 5 of $n+$ type, 1 micron in thickness, having a doping concentration of the order of $10^{19}$ at/cm$^3$, and the zones 6 of $n$- type, having a doping concentration of $10^{17}$ at/cm$^3$ and a thickness of 0.5 microns.

In the zones 6, zones 7 of $p^+$ type are implanted, 0.7 micron thick and having a doping concentration of $10^{19}$ at/cm$^3$. One of these zones 7 is used to contact zone 4. Metallised areas 6 enable contacts to be established at the points E, M, S.

An element built in this fashion occupies an area of 2 × 5 microns square; the spacing between two elements can be no greater than 1 micron.

As far as a store cell of the kind illustrated in FIG. 3 is concerned, comprising elements having the characteristics just enumerated, the supply voltage should be double the threshold voltage which is of the order of $-0.5$ v. It is therefore of the order of $-1$ v.

The trigger stage has two stable states as summarised in the following Table:

| State | $V_{S1}$ | $I_{S1}$ | $V_{E1}$ | $I_{E1}$ |
| --- | --- | --- | --- | --- |
| "0" | $-0.15$ | $-5\mu A$ | $-0.7$ | $-2\mu A$ |
| "1" | $-1$ | 0 | $-1$ | 0 |

When the address voltage is applied at $TT_2$, it must drive the latter conductive. The address voltage requires to be of the order of 1.5 v.

FIG. 5 illustrates the integration diagram of the device shown in FIG. 2. There can be seen the two components $TT_1$ and $TT_2$, the saturable resistors $R_1$, $R_2$ and $R_3$, the points $E_1$, $E_2$, $M_1$, $M_2$, $S_1$, $S_2$.

In the example described it is possible to see what are the orders of magnitude of the voltages and currents applied and flowing in the various parts of the store element described hereinbefore by way of example.

The complete cell occupies $6 \times 15 \mu^2$. Addressed, it draws 10 microamps in the conductive state, 3 in the blocked state. Addressing draws 3 microamps per cell.

The elements are formed in p-type enclosures in n-type silicon substrates. They are therefore isolated from one another. This makes it possible to reduce the insulation spaces to a minimum.

What we claim:

1. A semiconductor store element, having two stable states, one state in which it is conductive and the other in which it is blocked, comprising a first pnpn structure, a common region being the collector to a first transistor and comprising a zone of very small size constituting the base of the second transistor, the current flowing parallel to the substrate surface in one of the transistor and perpendicularly thereto in the other, a d.c bias source, two resistors connecting respectively said region and the collector of the second transistor to said bias source, a two-way gate making it possible, on the one hand to address said trigger stage and on the other hand to apply to it the write-in signals.

2. An element as claimed in claim 1, said gate being a second pnpn structure identical to said first structure, addressing being performed by the application of a word signal to the emitter of the second transistor thereof, said signal having a sufficient amplitude to drive the gate conductive, the write-in signals being applied to the emitter of the first transistor and the common base-collector region of said second component being connected to the corresponding region of the store element.

3. An element as claimed in claim 2, the two structures being integrated into one and the same substrate, the latter having the opposite conductivity type to that of the common base-collector regions of the two elements.

4. An element as claimed in claim 3, wherein substrate is of weakly-doped p-type material, the various elements of the two structures being implanted in the substrate.

5. An element as claimed in claim 3, wherein the resistors are saturable resistors integrated into said substrate.

* * * * *